United States Patent
Wiebelt et al.

(10) Patent No.: US 11,818,873 B2
(45) Date of Patent: Nov. 14, 2023

(54) INDUCTION CHARGING DEVICE FOR A VEHICLE CHARGING SYSTEM

(71) Applicant: Mahle International GmbH, Stuttgart (DE)

(72) Inventors: Achim Wiebelt, Neustadt (DE); Volker Schall, Hemmingen (DE); Christopher Laemmle, Stuttgart (DE); Holger Schroth, Maulbronn (DE)

(73) Assignee: MAHLE International GmbH

( * ) Notice: Subject to any disclaimer, the term of this patent is extended or adjusted under 35 U.S.C. 154(b) by 329 days.

(21) Appl. No.: 17/129,378

(22) Filed: Dec. 21, 2020

(65) Prior Publication Data

US 2021/0195811 A1    Jun. 24, 2021

(30) Foreign Application Priority Data

Dec. 20, 2019  (DE) .......................... 102019220463.5

(51) Int. Cl.
*H02J 50/12*  (2016.01)
*H05K 7/20*  (2006.01)
(Continued)

(52) U.S. Cl.
CPC ........ *H05K 7/20945* (2013.01); *B60L 53/126* (2019.02); *B60L 53/302* (2019.02); *H02J 50/12* (2016.02); *H02J 50/40* (2016.02)

(58) Field of Classification Search
CPC .. H01F 27/24; H01F 27/2823; H01F 27/2885; H01F 27/306; H01F 27/366;
(Continued)

(56) References Cited

U.S. PATENT DOCUMENTS

2014/0015522 A1    1/2014  Widmer
2016/0250935 A1    9/2016  Yuasa
(Continued)

FOREIGN PATENT DOCUMENTS

DE    102008054949 A1    6/2010
DE    102009011998 A1    9/2010
(Continued)

OTHER PUBLICATIONS

German Search report dated Dec. 7, 2020 for copending German Appl. No. DE102019220463.5.
(Continued)

*Primary Examiner* — Bryan R Perez
(74) *Attorney, Agent, or Firm* — Fishman Stewart PLLC

(57) ABSTRACT

An induction charging device for a vehicle charging system may include a magnetic field conductor, a control device, a temperature-control device configured to temperature-control the magnetic field conductor, and an induction coil configured to at least one of transmit and receive a wireless energy transmission. The temperature-control device configured such that a temperature-control fluid is flowable therethrough. The induction charging device may include a first temperature sensor configured to determine a temperature of a temperature-control side of the magnetic field conductor. The induction charging device may include at least one of (i) a second temperature sensor configured to determine a temperature of a coil side of the magnetic field conductor, and (ii) a temperature-control fluid temperature sensor configured to measure a temperature-control fluid temperature of the temperature-control fluid in the temperature-control device. The control device may be configured to limit a thermal load of the magnetic field conductor.

23 Claims, 3 Drawing Sheets

(51) Int. Cl.
*B60L 53/302* (2019.01)
*B60L 53/126* (2019.01)
*H02J 50/40* (2016.01)

(58) Field of Classification Search
CPC ...... H01F 27/085; H01F 27/22; H01F 27/025; H01F 27/36; H01F 27/02; H01F 27/10; H01F 27/28; H01F 27/2876; H01F 27/363; H01F 1/44; H01F 2003/005; H01F 38/14
See application file for complete search history.

(56) References Cited

U.S. PATENT DOCUMENTS

2018/0154781 A1* 6/2018 Ansari .................... H01F 38/14
2019/0241087 A1   8/2019 Islinger et al.
2019/0333676 A1  10/2019 Shin

FOREIGN PATENT DOCUMENTS

| EP | 2963763 A1 | 1/2016 |
| WO | 2019170594 A1 | 9/2019 |
| WO | 2019170838 A1 | 9/2019 |

OTHER PUBLICATIONS

English translation of CN Search Report for CN-2020114894429, dated Aug. 21, 2023.
English translation of CN Office Action for CN-202011489442.9, dated Aug. 25, 2023.

* cited by examiner

INDUCTION CHARGING DEVICE FOR A VEHICLE CHARGING SYSTEM

CROSS-REFERENCE TO RELATED APPLICATIONS

This application claims priority to German Patent Application No. DE 10 2019 220 463.5, filed on Dec. 20, 2019, the contents of which is hereby incorporated by reference in its entirety.

TECHNICAL FIELD

The present invention relates to an induction charging device for a vehicle charging system and to a method for limiting the thermal load of a magnetic field conductor of such an induction charging device. The invention, furthermore, relates to a vehicle charging system and to a vehicle having an induction charging device according to the invention.

BACKGROUND

In order to increase the acceptance by end users of electrically driven vehicles it can be advantageous when the energy transmission between a stationary energy source and a traction accumulator unit of the vehicle takes place in a contactless or wireless manner. A wireless energy transmission is advantageous for end users since for example no charging cables have to be carried along or plugged in. In addition, stationary induction charging stations can be partly buried in the ground area so that a better integration in a townscape or landscape is possible.

Induction charging stations comprise magnetic field conductors for conducting magnetic fields in order to make possible a reduction of transmission losses during the wireless energy transmission. Despite this, every wireless energy transmission is afflicted by certain transmission losses. This can include for example ohmic losses which lead to a thermal loading of an induction coil of the induction charging device and heat up the same. Furthermore, magnetising reversal losses can occur in the magnetic field conductor and/or eddy current losses in electrically conductive components of the induction charging device and/or regulating or switching losses in power electronic components of the induction charging device.

These transmission losses result for example in a thermal loading of the magnetic field conductor of the induction charging device, wherein in particular temperature gradients can develop within the magnetic field conductor.

In the magnetic field conductor, which can be designed for example as a sintered ferrite body, such temperature gradients can cause thermal expansions (thermomechanics), which in an unforced position impose a curvature and/or deformation on the magnetic field conductor. When however the magnetic field conductor is for example in a forced position in an induction charging device, in which for example the curvature and/or distortion cannot materialise without obstacles, the thermal expansions have to be compensated through suitable mechanical expansions of the magnetic field conductor so as to maintain the forced position.

Because of the manufacture by a sintering process, magnetic field conductors of ferritic material have very brittle (glass-like) material properties, which is why this material can only absorb very minor mechanical expansions before it breaks. Any disruption in the structure of the ferritic material (e.g. micro-cracks) negatively affects the electromagnetic properties of the magnetic field conductor and thus results in a major reduction of the efficiency of the energy transmission, which is why a mechanical overloading of the magnetic field conductor should be avoided or at least minimised. In addition, any structural disruption in the magnetic field conductor results in increased and/or additional transmission losses which additionally amplify the thermomechanical expansion process of the magnetic field conductor.

At a transmission power above 10 kW, induction charging devices are equipped with a fluid-circulated temperature-control device in order to discharge the transmission losses, which result in a thermal loading of the magnetic field conductor, into surroundings of the induction charging device. In certain situations, in particular at the start of an energy transmission, it can be possible that a very warm temperature-control fluid flows into a very cold induction charging device or that a cold temperature-control fluid flows into a very warm induction charging device. This can result in a thermal shock which forms high temperature gradients in the magnetic field conductor, which in turn result in damage to the structure of the magnetic field conductor and impair the ferritic properties of the magnetic field conductor. Through this accelerated ageing of the magnetic field conductor, the efficiency of the entire energy transmission is significantly reduced which can result in that the monitoring systems of the vehicle charging system no longer allow an energy transmission.

SUMMARY

The present invention is based on the object of stating an induction charging device and a method for such an induction charging device which avoids or at least reduces ageing of and/or damage to the magnetic field conductor due to thermal loads.

According to the invention, this problem is solved through the subject matter of the independent claim(s). Advantageous embodiments are the subject matter of the dependent claim(s).

The present invention is based on the general idea of suppressing or at least reducing an impermissible thermal loading of the magnetic field conductor, in particular the development of impermissible temperature gradients in the magnetic field conductor.

The induction charging device for a vehicle charging system according to the invention comprises at least one magnetic field conductor and at least one control device. Here and/or in the following, the term of a control device can mean a regulating device. A control device can form a regulating device and/or be a regulating device.

Compared with air, the magnetic field conductor has a higher magnetic permeability and can at least partly be formed of ferrimagnetic and/or ferromagnetic materials. The magnetic field conductor can be formed as plate element and/or as a sintered plate element. The induction charging device can comprise multiple magnetic field conductors, in particular multiple magnetic field conductors spaced apart from one another.

Furthermore, the induction charging device comprises at least one temperature-control device for temperature-controlling the magnetic field conductor with a temperature-control power preset by the control device. The temperature-control device is designed so that it can be flowed through by a temperature-control fluid for temperature-controlling the magnetic field conductor. A temperature control of the magnetic field conductor can mean a cooling of the magnetic field conductor by the temperature-control device or a heating of the magnetic field conductor by the temperature-control device. A temperature-control fluid, which flows through the temperature-control device for temperature-controlling the magnetic field conductor can be formed as a temperature-control liquid, in particular as coolant or refrigerant. It can be provided that the temperature-control fluid when flowing through the temperature-control device passes heat energy on to the magnetic field conductor thus heating the same or that the temperature-control fluid when flowing through the temperature-control device absorbs heat energy of the magnetic field conductor thus cooling the same.

The temperature-control power preset by the control device can be a cooling power or a heating power. The temperature-control power can be effected via an adjustment of the mass flow of the temperature-control fluid which flows through the temperature-control device. Such an adjustment of the mass flow of the temperature-control fluid can be carried out in that the control device activates a delivery device, in particular an electrically driven delivery device or an electric fluid pump for delivering the temperature-control fluid into a temperature-control fluid circuit, wherein the temperature-control device can be fluidically connected to the temperature-control fluid circuit or wherein the temperature-control device at least partially forms the temperature-control fluid circuit.

The temperature-control power can be effected via an adjustment of the temperature-control fluid temperature on the advance side. To this end, the control device can activate a heat exchanger device in order to carry out an adjustment of the temperature-control fluid temperature on the advance side. The heat exchanger device can be designed for example as additional heat exchanger or as electric additional heater or as chiller unit, in particular as liquid-cooled heat exchanger. A chiller unit can be fluidically connected to an additional refrigerant circuit and/or operated with the same.

The expression "temperature-control power preset by the control device" does not mean that this temperature-control power has to be specifically measured, calculated, determined or established at any point in time. Presetting of a temperature-control power of the control device can also be carried out in that for example merely the mass flow of the temperature-control fluid or the temperature of the temperature-control fluid is regulated up or down until a desired measurement variable is in a desired range. In the process, for example the mass flow of the temperature-control fluid does not even have to be specifically measured, calculated, defined or determined.

Furthermore, the induction charging device comprises at least one induction coil for the wireless energy transmission or for receiving wirelessly transmitted energy with a transmission power preset by the control device. The induction coil can be designed as a flat spiral coil or as a double-D coil. The induction coil can be designed as primary coil which generates a magnetic field that varies with time in order to make possible a wireless energy transmission with the preset transmission power. To this end, the primary coil can be supplied with the required electric energy via a stationary energy source. The induction coil can be designed as secondary coil in which an electric alternating voltage and/or an electric alternating current is induced in the case that the secondary coil is situated in the range of a magnetic field of a primary coil that varies with time.

An induction coil designed as primary coil can receive electromagnetic control signals and/or send electromagnetic control signals. An induction coil designed as secondary coil can receive electromagnetic control signals and/or send electromagnetic control signals. Here it can be provided that the primary coil and the secondary coil communicate with one another via electromagnetic control signals, in particular via frequency and/or amplitude-modulated electromagnetic control signals. Thus it can be provided for example that a wireless energy transmission at a preset transmission power can exclusively take place from a primary coil to a secondary coil, whereas a communication by means of electromagnetic control signals can take place from the primary coil to the secondary coil as well as from the secondary coil to the primary coil.

In the case that the induction coil is designed as primary coil, the control device can effect the transmission power by activating a power electronic unit of the induction charging device. In the case that the induction coil is designed as secondary coil, the control device can bring about and/or initiate the transmission power by transmitting a power adjustment request to the device with the primary coil. In the simplest form, the control signal can be for example a type of dead man signal (e.g. a permanent signal or a recurring signal within defined time intervals) which is permanently sent by the ready device with the secondary coil and as soon as the signal stops, the transmission also ends. Additionally or alternatively, a communication, in particular a more intelligent communication can take place between the device with the secondary coil in the vehicle and the device with the primary coil which is designed in such a manner that the device with the primary coil is informed and/or determines the required transmission power. This can take place for example by a transmission of a suitable control signal to the primary coil. The device with the primary coil can subsequently carry out an adjustment of the transmission power according to the control signal received.

It can be provided that the preset transmission power has a maximum transmission power of at least 10 kW. A maximum transmission power of at least 10 kW can be advantageous in particular for charging a traction accumulator unit of a vehicle in order to minimise the required charging time.

With respect to an axial axis, the temperature-control device and the induction coil are arranged spaced apart from one another, wherein the magnetic field conductor is arranged with respect to the axial axis between the temperature-control device and the induction coil. With respect to the axial axis, the temperature-control device is located opposite a temperature-control side of the magnetic field conductor and/or faces the same, wherein the induction coil with respect to the axial axis is located opposite a coil side of the magnetic field conductor and/or faces the same. The axial axis can be substantially orientated perpendicularly and/or transversely to the temperature-control side of the magnetic field conductor and/or towards the coil side of the magnetic field conductor. The temperature-control side of the magnetic field conductor can be formed by a surface of the magnetic field conductor on the temperature-control side. The coil side of the magnetic field conductor can be formed by a surface of the magnetic field conductor on the coil side. The temperature-control side of the magnetic field conductor and the coil side of the magnetic field conductor can be spaced apart from one another with respect to the axial axis. The spacing of the temperature-control side of the magnetic field conductor and the coil side of the magnetic field conductor can define the thickness of the magnetic field conductor with respect to the axial axis. The induction coil can be substantially wound about the axial axis.

It can be provided that the temperature-control device mechanically contacts the temperature-control device temperature-control side of the magnetic field conductor, in particular a temperature-control side surface of the magnetic field conductor directly or indirectly. Upon a direct contacting, the magnetic field conductor can lie against the temperature-control device in a mechanically contacting manner free of an intermediate substance or intermediate material. Upon an indirect contacting, an intermediate substance and/or an intermediate material, in particular an adhesive and/or a heat-conducting means and/or a heat-conducting paste can be arranged between the magnetic field conductor and the temperature-control device.

It can be provided that the temperature-control fluid substantially flows through the temperature-control device transversely to the axial axis in order to provide a temperature control of the magnetic field conductor. It can be provided that the temperature-control device has a fluid inlet and a fluid outlet, wherein the fluid inlet and the fluid outlet are fluidically interconnected via a fluid passage and/or via a fluid passage system of the temperature-control device. A temperature-control fluid can flow into the temperature-control device via the fluid inlet and flow out of the temperature-control device via the fluid outlet. The fluid inlet and the fluid outlet can each be fluidically connected to a temperature-control fluid circuit.

Furthermore, the induction charging device comprises a first temperature sensor for determining a temperature-control-side magnetic field conductor temperature of the temperature-control-side and a second temperature sensor for determining a coil-side magnetic field conductor temperature of the coil side and/or a temperature-control fluid temperature sensor for measuring a temperature-control fluid temperature of the temperature-control fluid in the temperature-control device. The first temperature sensor and the second temperature sensor and/or the temperature-control fluid temperature sensor are each communicatingly connected to the control device. The first temperature sensor and the second temperature sensor and/or the temperature-control fluid temperature sensor can each transmit temperature measurement values to the control device.

Here, a communicating connection means that between two components that are communicatingly connected to one another a bi-directional or uni-directional data connection can be provided, with which electrical control, regulating and/or measurement signals are transmittable in analogue or digital form. The communication between more than two components can be realised with a bus system.

The temperature-control fluid temperature sensor can be designed for measuring a temperature-control fluid temperature on the advance side. By way of this, for example the temperature of the temperature-control fluid can be measured on flowing into the temperature-control device. The temperature-control fluid temperature sensor can be arranged for example in the fluid inlet of the temperature-control device in order to carry out a measurement of a temperature-control fluid temperature on the advance side.

The first temperature sensor and the second temperature sensor can each be designed as measurement resistors, in particular as cost-effective platinum measurement resistors (e.g. PT100), which mechanically contact for example the magnetic field conductor at the respective measurement point directly or indirectly. Here, the temperature sensors can be arranged at the temperature measurement point of the magnetic field conductor on the magnetic field conductor assigned to them. Such temperature sensors can be arranged for example at temperature measurement points at which the electromagnetic load happens to be lower such as for example in the edge region of the induction charging device.

The first temperature sensor and the second temperature sensor can each be designed as optical temperature sensors, in particular as infrared temperature sensors, which make possible a contactless temperature measurement of the magnetic field conductor. Here, the first temperature sensor and the second temperature sensor can be arranged spaced apart from the magnetic field conductor. By way of this, a self-heating of the temperature sensors by the active magnetic field can be avoided or at least reduced. Here, the first temperature sensor and the second temperature sensor can be arranged spaced apart from the temperature measurement points on the magnetic field conductor assigned to them.

The first temperature sensor can carry out a temperature measurement of the magnetic field conductor at a first temperature measurement point of the magnetic field conductor, which for example with respect to the axial axis is arranged nearer the temperature-control side of the magnetic field conductor than the coil side of the magnetic field conductor.

The second temperature sensor can carry out a temperature measurement of the magnetic field conductor at a second temperature measurement point of the magnetic field conductor, which is arranged for example with respect to the axial axis nearer the coil side of the magnetic field conductor than to the temperature-control side of the magnetic field conductor.

The first temperature measurement point of the magnetic field conductor and the second temperature measurement point of the magnetic field conductor can be arranged spaced apart from one another with respect to the axial axis. The first temperature measurement point of the magnetic field conductor and the second temperature measurement point of the magnetic field conductor can be arranged aligned and/or located opposite with respect to the axial axis. The first temperature measurement point of the magnetic field conductor and the second temperature measurement point of the magnetic field conductor can be arranged aligned and/or located opposite with respect to the axial axis, so that the differential of the temperature measurement values at the temperature measurement points makes possible determining a temperature gradient along the axial axis.

It can be provided that the temperature-control device is formed from an electrically conductive material in order to form an electromagnetic shielding element. Furthermore, the induction charging device can form a housing with a bottom section and a lid section, wherein the bottom section and the lid section can form a housing interior. The housing interior can be designed fluidically sealed relative to a surroundings of the induction charging device. The lid section can be formed by the temperature-control device.

The magnetic field conductor, the induction coil, the first temperature sensor and the second temperature sensor can be arranged in the housing interior of the housing of the induction charging device. The temperature-control fluid temperature sensor can be arranged outside of the housing interior of the housing of the induction charging device.

The control device is designed and/or programmed for limiting the thermal loading of the magnetic field conductor. In particular, the control device can be designed and/or programmed for limiting thermal shocks of the magnetic field conductor and/or for avoiding impermissible temperature gradients in the magnetic field conductor.

Furthermore, the invention provides a method for limiting the thermal loading of a magnetic field conductor of an induction charging device according to the invention. This method can be designed for limiting thermal shocks of the magnetic field conductor and/or for avoiding impermissible temperature gradients in the magnetic field conductor.

With the method according to the invention it is provided that the first temperature sensor transmits a first temperature value to the control device, with which the control device determines a magnetic field conductor temperature of the temperature-control side on the temperature-control side. It is provided, furthermore, that the temperature sensor transmits a second temperature value to the control device, with which the control device determines a magnetic field conductor temperature of the coil side on the coil side. The control device determines a temperature gradient value from the absolute amount of the differential between the determined temperature-side magnetic field conductor temperature and the determined coil-side magnetic field conductor temperature, wherein the control device compares the temperature gradient value with a predefined gradient limit value. The control device carries out an adjustment of the temperature-control power of the temperature-control device and/or an adjustment of the temperature-control power of the temperature-control device and/or an adjustment of the transmission power of the induction charging device and/or of the induction coil and/or of a transmission power adjustment device in the case that the temperature gradient value is greater than the predefined gradient limit value.

The temperature gradient value can correspond to the absolute amount of a temperature gradient within the magnetic field conductor with respect to the axial axis.

Here, the adjustment of the temperature-control power of the temperature-control device and/or the adjustment of the transmission power of the induction charging device can take place until the temperature gradient value is smaller than the predefined gradient limit value or corresponds to the same. By way of this, the impact time of temperature gradients on the magnetic field conductor can be minimised and the development of impermissible temperature gradients suppressed, so that an ageing of or damage to the magnetic field conductor is prevented or at least reduced.

The transmission of the temperature measurement values and the adjustment of the temperature-control power of the temperature-control device and/or the adjustment of the transmission power of the induction charging device can take place continuously.

In an advantageous further development of the solution according to the invention it is provided that the temperature-control fluid temperature sensor transmits a measured temperature-control fluid temperature of the temperature-control fluid, which flows through the temperature-control device for temperature-controlling the magnetic field conductor, to the control device. The measured temperature-control fluid temperature of the temperature-control fluid can be a temperature-control fluid temperature on the advance side, which was measured in the fluid inlet of the temperature-control device.

Furthermore it is provided that the control device determines a differential value from the absolute amount of the differential between the determined temperature-control-side magnetic field conductor temperature and the measured temperature-control fluid temperature, wherein the control device compares the differential value with a predefined differential limit value. The control device carries out an adjustment of the temperature-control power of the temperature-control device and/or an adjustment of the transmission power of the induction charging device and/or of the induction coil and/or of the transmission power adjustment device in the case that the differential value is greater than the predefined differential limit value.

Here, the adjustment of the temperature-control power of the temperature-control device and/or the adjustment of the transmission power of the induction charging device can take place until the differential value is smaller than the predefined differential limit value or corresponds to the same.

By way of this, thermal shocks of the magnetic field conductor for example can be avoided. In particular, any heat input and/or cold input into the magnetic field conductor can be monitored via the temperature-control device so that taking into account the temperature conductivity of the magnetic field conductor, in particular of the ferrite material, local exceeding of the thermomechanical stresses in the magnetic field conductor, in particular in the ferrite material, can be avoided. In a further advantageous embodiment of the solution according to the invention it is provided that the control device compares the determined temperature-control-side magnetic field conductor temperature and/or the determined coil-side magnetic field conductor temperature with a predefined temperature limit value and that the control device carries out an adjustment of the temperature-control power of the temperature-control device and/or an adjustment of the transmission power of the induction charging device in the case that the determined temperature-side magnetic field conductor temperature and/or the determined coil-side magnetic field conductor temperature is greater than the predefined temperature limit value.

Here, the adjustment of the temperature-control power of the temperature-control device and/or the adjustment of the transmission power of the induction charging device can take place until the determined temperature-control-side magnetic field conductor temperature and/or the determined coil-side magnetic field conductor temperature is smaller than the predefined temperature limit value or corresponds to the same.

The temperature limit value can be below the Curie temperature of the material, in particular of the ferrite material, of the magnetic field conductor. This is important in particular since at temperatures of the magnetic field conductor above the Curie temperature of the magnetic field conductor material the magnetic properties of the magnetic field conductor, in particular of the ferrite material, disappear.

In an advantageous further development of the solution according to the invention it is provided that the control device carries out a wireless energy transmission at a maximum transmission power of the induction charging device in the case that the temperature gradient value is smaller than the predefined gradient limit value or corresponds to the same, and/or in the case that the differential value is smaller than the predefined differential limit value or corresponds to the same, and/or in the case that the determined temperature-control-side magnetic field conductor temperature and/or the determined coil-side magnetic field conductor temperature is smaller than the predefined temperature limit value or corresponds to the same.

"Maximum transmission power" is not considered any technically possible value but a non-reduced standard value of the transmission power with which transmission is carried out when the determined temperatures and/or determined temperature quotients and/or determined temperature gradient values do not speak against a transmission at this non-reduced standard value.

In a further advantageous embodiment of the solution according to the invention it is provided that the first temperature sensor transmits a first temperature value to the control device, which was measured on the temperature-control side of the magnetic field conductor and/or that the second temperature sensor transmits a second temperature value to the control device which was measured on the coil side of the magnetic field conductor.

The first temperature sensor can transmit a first temperature value to the control device, which was measured on the temperature-control side surface of the magnetic field conductor, which forms the temperature-control side of the magnetic field conductor.

The second temperature sensor can transmit a second temperature value to the control device, which was measured on the coil-side surface of the magnetic field conductor, which forms the coil side of the magnetic field conductor.

In an advantageous further development of the solution according to the invention it is provided that the first temperature sensor transmits a first temperature value to the control device, which was measured at a measurement point on the magnetic field conductor spaced apart from the temperature-control side, and that the control device with a stored transmission function determines from the first temperature value the temperature-control-side magnetic field conductor temperature on the temperature side. Furthermore it is provided that the second temperature sensor transmits a second temperature value to the control device, which was measured at a measurement point on the magnetic field conductor spaced apart from the coil side, and that the control device with a stored transmission function determines from the second temperature value the coil-side magnetic field conductor temperature on the coil side.

The stored transmission function can be determined for example through measurements and/or simulations in particular through numerical three-dimensional simulations.

By way of this, the temperature sensors can carry out for example measurements at temperature measurement points and/or be arranged at temperature measurement points which from a design point of view are more easily accessible and/or at which a lower electromagnetic load occurs. A measurement point can mean a temperature measurement point.

In a further advantageous embodiment of the solution according to the invention it is provided that the control device, with at least one stored correcting function, corrects the temperature values of the first temperature sensor and/or the temperature values of the second temperature sensor and/or the measured temperature-control fluid temperature of the temperature-control fluid temperature sensor with respect to electromagnetic effects and/or with respect to parasitic thermal effects.

Parasitic thermal effects is to mean for example thermal effects which act on the respective temperature sensor but do not emanate from the object whose temperature is to be determined. Parasitic thermal effects can act in a distorting manner for example on the temperature sensors by way of the external surroundings in particular on hot summer days.

The stored correcting function can be determined for example through measurements and/or through simulations, in particular through numerical three-dimensional simulations.

By way of this, cost-effective sensors (e.g. PT100) can be used since the influence of the self-heating with a given magnetic field strength can be established and taken into account in determining the temperature gradient value in the magnetic field conductor.

In an advantageous further development of the solution according to the invention it is provided that the first temperature sensor carries out a contactless temperature measurement of the magnetic field conductor or a contacting temperature measurement of the magnetic field conductor, and/or that the second temperature sensor carries out a contactless temperature measurement of the magnetic field conductor or a contacting temperature measurement of the magnetic field conductor.

A contactless temperature measurement can take place for example by means of infrared measurement using an infrared temperature sensor.

In a further advantageous embodiment of the solution according to the invention it is provided that the control device, by means of a stored heat transfer characteristic diagram, determines from operating parameters of the induction charging device, in particular from the determined temperature-control-side magnetic field conductor temperature and from the determined coil-side magnetic field conductor temperature and from the temperature-control power of the temperature-control device and from the transmission power of the induction charging device, a time forecast of the temperature gradient for a predefined time interval, wherein the control device determines a maximum forecast value of the temperature gradient within the predefined time interval and that the control device establishes this maximum forecast value of the temperature gradient within the predefined time interval as temperature gradient value.

The predefined time interval can be preset by the thermal inertia of the induction charging device and/or by the thermal inertia of the magnetic field conductor. In particular, the predefined interval can be between 30 seconds and five minutes. The heat transfer characteristic diagram can be determined for example through measurements and/or through simulations, in particular through numerical three-dimensional simulations.

By way of this time forecast, the control device can timely counteract impermissible temperature gradient values above a predefined gradient limit value by an adjustment of the temperature-control power of the temperature-control device and/or by an adjustment of the transmission power of the induction charging device.

The operating parameters can also include the ambient temperature of the induction charging device and/or the operating hours of the induction charging device and/or the geographical area of use of the induction charging device and/or the year of manufacture of the induction charging device and/or the manufacturing plant of the induction charging device.

In an advantageous further development of the solution according to the invention it is provided that the control device transmits operating parameters of the induction charging device, in particular the determined temperature-control-side magnetic field conductor temperature and/or the determined coil side magnetic field conductor temperature and/or the temperature-control power of the temperature-control device and/or the transmission power of the induction charging device to a computer facility that is separate with respect to the induction charging device via a data network, in particular via a wireless data network, wherein the computer device determines a heat transfer characteristic diagram by means of computer-implemented analytical methods. The data or operating parameters of the induction charging device can also be transmitted to a cloud (big data).

The operating parameters can also include the ambient temperature of the induction charging device and/or the operating hours of the induction charging device and/or the geographical area of use of the induction charging device and/or the year of manufacture of the induction charging device and/or the manufacturing plant of the induction charging device and/or failures of the induction charging device.

It can be provided that the operating parameters of a multiplicity of induction charging devices are transmitted to the separate computer facility and/or the cloud. These operating parameters can be examined through algorithms, in particular through algorithms from the field of artificial intelligence (AI) for correlations in order to deduce better regulating strategies for the induction charging device from this. These algorithms can provide for example the use of artificial neuronal networks, in particular multi-layered neuronal networks.

In a further advantageous embodiment of the solution according to the invention it is provided that the heat transfer characteristic diagram determined by the computer facility is transmitted to the control device via a data network, in particular via a wireless data network, wherein the heat transfer characteristic diagram transmitted to the control device replaces a heat transfer characteristic diagram stored in the control device prior to the transmission. The transmission of the heat transfer characteristic diagram can take place during a firmware update of the induction charging device. By way of this, the lifespan of the magnetic field conductor, in particular of a ferritic magnetic field conductor, can be further increased optimised operation of the induction charging device.

In an advantageous further development of the solution according to the invention it is provided that an adjustment of the temperature-control power of the temperature-control device takes place through an adjustment of the temperature-control fluid temperature of the temperature-control fluid, and/or in that an adjustment of the temperature power of the temperature-control device takes place through an adjustment of the mass flow of the temperature-control fluid.

Such an adjustment of the mass flow of the temperature-control fluid can be carried out in that the control device activates a delivery device, in particular an electrically driven delivery device or an electric fluid pump for delivering the temperature-control fluid into a temperature-control fluid circuit, wherein the temperature-control device can be fluidically connected to the temperature-control fluid circuit or wherein the temperature-control device at least partly forms the temperature-control fluid circuit.

The regulation of the mass flow of the temperature-control fluid can be the measure which, with an existing electrical delivery device, requires the least effort and can therefore be always preferred over the other measures. Of course this requires as prerequisite that an adjustment of the temperature-control power of the temperature-control device through an adjustment of the mass flow of the temperature-control fluid is sufficient in order to adjust the temperature gradient value and/or the differential value in the required manner.

The possibility of pre-conditioning the temperature-control fluid to the temperature of the induction charging device and/or of the magnetic field conductor is also conceivable. By way of this, the immediate energy transmission with maximum transmission power would be possible without incurring a risk of damaging the magnetic field conductor, in particular the ferrites. However this is always connected with the operation of an additional heat exchanger. This can be for example an additional electric heater or a chiller combined with an operation of a refrigerant circuit. Because of this expenditure, the pre-conditioning of the temperature-control fluid should be implemented as a last measure.

In a further advantageous embodiment of the solution according to the invention it is provided that upon an adjustment of the temperature-control power of the temperature-control device the temperature-control power during a predefined operating period of the induction charging device is increased from a starting value to an end value, and/or that upon an adjustment of the temperature-control fluid temperature of the temperature-control fluid the temperature-control fluid temperature during a predefined operating period of the induction charging device is increased from a starting value to an end value, and/or that upon an adjustment of the mass flow of the temperature-control fluid the mass flow during a predefined operating period of the induction charging device is increased from a starting value to an end value, and/or the upon an adjustment of the transmission power of the induction charging device the transmission power during a predefined operating period of the induction charging device is increased from a starting value to an end value.

The starting value of the temperature-control power can be smaller than the end value of the temperature-control power. The starting value of the temperature-control fluid temperature can be smaller than the end value of the temperature-control fluid temperature. The starting value of the mass flow can be smaller than the end value of the mass flow.

In terms of time, the predefined operating period can be for example before and/or during and/or after a wireless energy transmission. The predefined operating period can depend for example on the thermal inertia of the magnetic field conductor and/or on the thermal inertia of the induction charging device.

It can be provided that firstly the differential value is determined and that, if the same is greater than the predefined differential limit value, countermeasures as described are directly taken. It can be provided that the temperature gradient value is established in the case that the differential value does not or longer exceed the differential limit value and that countermeasures as described are taken in the case that the temperature gradient value exceeds the gradient limit value. It can be provided that in the case that the differential value does not exceed the different limit value and the temperature gradient value does not exceed the gradient limit value, it is then verified if the temperature-control-side magnetic field conductor temperature and/or the coil-side magnetic field conductor temperature exceed the temperature limit value and that described countermeasures are taken if appropriate. In a further advantages embodiment the sequence of these queries can be interchanged.

For example, a thermal preconditioning of the induction charging device and/or of the magnetic field conductor can take place by temperature-controlling the temperature-control fluid without running energy transmission.

In the case of a sub-cooled induction cooling device and/or of a sub-cooled magnetic field conductor, a sole adjustment of the mass flow of the temperature-control fluid cannot always ensure that a thermal shock stress is sufficiently low for the magnetic field conductor, in particular for a ferrite, with immediate maximum transmission power. In this case, the system should be initially brought slowly up to temperature with low heat input.

In the case of a temperature-control fluid that is warmer than the magnetic field conductor, a slow increase of the supply of the mass flow of the temperature-control fluid for preconditioning can be provided. In order to avoid impermissible temperature states the transmission power can be throttled or at least avoided until the temperature front of the heat introduced into the magnetic field conductor by the temperature-control fluid has effectively arrived on the coil side of the magnetic field conductor.

It can also be provided that the transmission power runs up in a throttled manner in order to utilise lower transmission losses in the form of heat loss for a safe and reliable heating of the induction charging device and/or of the magnetic field conductor. As soon as in this case the temperature front reaches the temperature-control device and/or the temperature-control side of the magnetic field conductor, feeding of a throttled mass flow of the temperature-control fluid to the induction charging device and/or feeding temperature-control fluid to the magnetic field conductor can commence depending on the current temperature-control fluid temperature and thus making possible a heating a temperature-control fluid circuit to an operating temperature in order to precondition for example vehicle components.

With a heated induction charging device and colder coolant (e.g. parking on heated asphalt) it is likewise not always possible to immediately start an energy transmission with maximum transmission power and dissipate the maximum cooling power at the same time. In this case, a matched cooling together with a throttled start-up phase also has to be effected for the transmission power.

In an advantageous further development of the solution according to the invention it is provided that an adjustment of the temperature-control power of the temperature-control device takes place simultaneously with an adjustment of the transmission power of the induction charging device, or that an adjustment of the temperature-control power of the temperature-control device takes place prior to a wireless energy transmission or prior to an adjustment of the transmission power of the induction charging device, or that an adjustment of the temperature-control power of the temperature-control device takes place after or during an adjustment of the transmission power of the induction charging device.

In a further advantageous embodiment of the solution according to the invention it is provided that an adjustment of the temperature-control power of the temperature-control device in the form of an adjustment of the mass flow of the temperature-control fluid takes place during an adjustment of the transmission power of the induction charging device in order to carry out a preconditioning of components, in particular of vehicle components, which are thermally coupled to a temperature-control fluid circuit which is fluidically connected to the temperature-control device.

In an advantageous further development of the solution according to the invention it is provided that the method is designed as computer-implemented method.

Furthermore, the invention relates to a computer program or a computer program product or a computer-readable data carrier, comprising commands which cause the device according to the invention to have the method steps executed according to a method according to the invention.

In an advantageous further development of the induction charging device according to the invention it is provided that the control device is configured and/or programmed so that it carries out the method according to the invention for limiting the thermal loading of the magnetic field conductor.

In an advantageous further development of the induction charging device according to the invention it is provided that the temperature-control device is fluidically connected to a temperature-control fluid circuit, wherein the temperature-control fluid circuit comprises an electrically driven delivery device for adjusting the mass flow of the temperature-control fluid and/or a heat exchanger device for adjusting the temperature-control fluid temperature of the temperature-control fluid, wherein the delivery device is communicatingly connected to the control device, and/or wherein the heat exchanger device is communicating connected to the control device.

Furthermore, the invention relates to a vehicle charging system having a stationary induction charging station, which is formed at least partially by an induction charging device according to the invention and having a vehicle, which comprises a mobile induction device, which is at least partially formed by an induction charging device according to the invention, wherein a wireless energy transmission from the stationary induction charging station to the mobile induction charging device of the vehicle can be effected. For this purpose, the stationary induction charging station can be connected to a stationary source of energy. The stationary induction charging station can be buried for example in the roadbed. The stationary induction charging station can form a primary coil while the induction charging device of the vehicle can form a secondary coil.

Furthermore, the invention relates to a vehicle for a vehicle charging system according to the invention having a mobile induction device which is at least partially formed by an induction charging device according to the invention and having a traction accumulator unit which is electrically coupled to the mobile induction charging device and suppliable with electric energy via the same.

The vehicle can be an electrically drive vehicle having at least one rotating electric machine, wherein the rotating electric machine ensures the drive of the vehicle and in the process is supplied with electric energy via the traction accumulator unit. The vehicle can be a road vehicle, in particular a trackless road vehicle. The vehicle can be an electric vehicle, a hybrid vehicle, or a plug-in hybrid vehicle.

The mobile induction charging device can be arranged in the vehicle in the vicinity of a roadbed. It can be provided that the induction coil of the induction charging device is arranged nearer the roadbed than the temperature-control device so that the temperature-control device can be employed for shielding further vehicle components regarding electromagnetic fields.

Furthermore, the invention relates to a method for operating a vehicle charging system according to the invention, in which a monitoring of the temperatures and/or temperature gradients of the stationary induction charging station and of the mobile induction device is carried out in particular as per the method according to the invention described before. Such monitoring can be carry out in particular for the stationary induction charging station and the mobile induction device at the same time.

A wireless energy transmission with maximum transmission power merely takes place in the case that the temperature gradient value in the stationary induction charging station and the mobile induction device is smaller than the predefined gradient limit value or corresponds to the same, and/or in the case that the differential value in the stationary induction charging station and the mobile induction device is smaller than the predefined differential limit value or corresponds to the same, and/or in the case that the determined temperature-control-side magnetic field conductor temperature and/or the determined coil side magnetic field conductor temperature in the stationary induction charging station and the mobile induction device is smaller than the predefined temperature limit value or corresponds to the same.

In an advantageous further development of the induction charging device according to the invention it is provided that the method is designed as a computer-implemented method.

Furthermore, the invention relates to a computer program or computer program product or computer-readable data carrier, comprising commands which cause the device, in particular the vehicle charging system, to execute the method steps according to the invention.

Furthermore, the invention relates to a vehicle charging system, wherein the stationary induction charging station and the mobile induction device, in particular their respective control devices, are configured and/or programmed so that they carry out the method according to the invention.

Further important features and advantages of the invention are obtained from the subclaims, from the drawings and from the associated figure description by way of the drawings.

It is to be understood that the features mentioned above and still to be explained in the following cannot only be used in the respective combination stated but also in other combinations or by themselves without leaving the scope of the present invention.

Preferred exemplary embodiments of the invention are shown in the drawings and are explained in more detail in the following description, wherein same reference numbers relate to same or similar or functionally same components.

BRIEF DESCRIPTION OF THE DRAWINGS

It shows, in each case schematically

DETAILED DESCRIPTION

Figure 1:
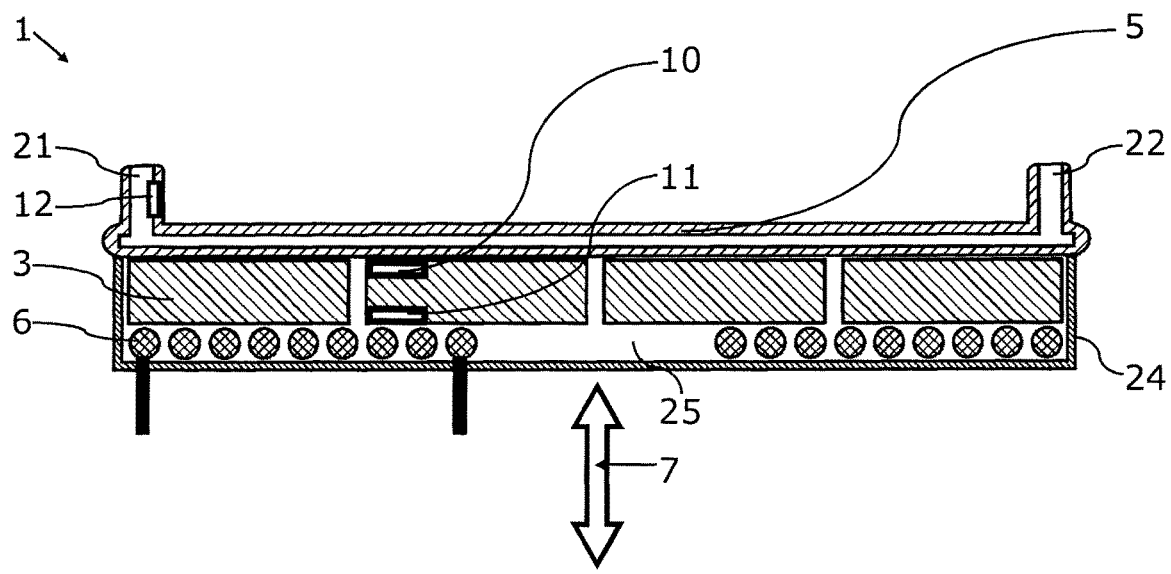
FIG. 1 shows a sectional view through an induction charging device according to the invention.
Figure 2:
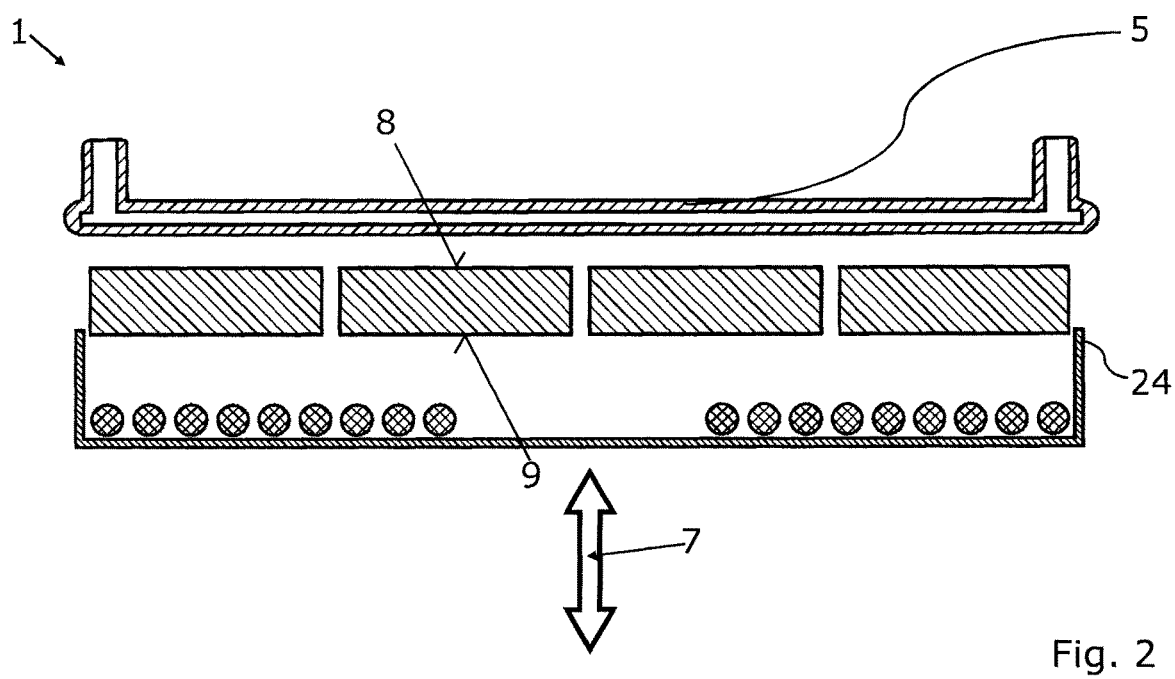
FIG. 2 shows an exploded representation of an induction charging device according to the invention.
Figure 5:
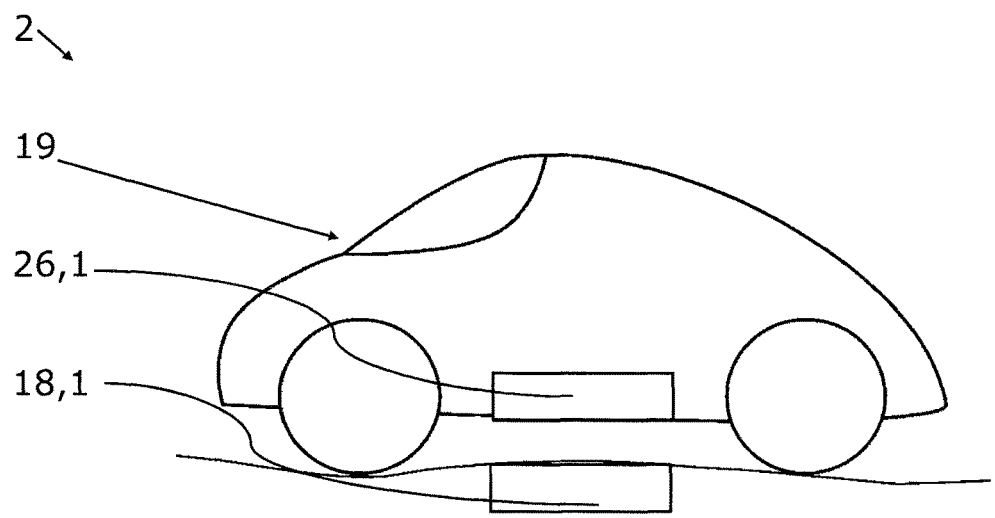
FIG. 5 shows a vehicle charging system according to the invention.

FIG. 1 shows an induction charging device 1 according to the invention for a vehicle charging system 2, which is shown in FIG. 5. The induction charging device 1 comprises multiple magnetic field conductors 3 spaced apart from one another, which are arranged in a housing interior 25. The housing interior 25 of the induction charging device 1 is formed by a temperature-control device 5 and by a bottom section 24.

In FIG. 1 to FIG. 4, the induction charging device 1 according to the invention exemplarily has an orientation that could be formed in a vehicle 19. In a mirrored view which with respect to a horizontal axis is orientated perpendicularly to an axial axis 7, FIG. 1 to FIG. 4 can also depict and/or represent a stationary induction charging station 18.

The temperature-control device 5 is designed for temperature-controlling the magnetic field conductor 3. For this purpose, the temperature-control device 5 is designed so that it can be flowed through by a temperature-control fluid, wherein the temperature-control fluid flows into the temperature-control device 5 via a fluid inlet 21 and flows out of the temperature-control device 5 via the fluid outlet 22. The fluid inlet 21 and the fluid outlet 22 are fluidically connected to one another via at least one fluid passage of the temperature-control device 5.

The induction charging device 1 comprises at least one induction coil 6 for the wireless energy transmission, which is arranged in the housing interior 25.

The temperature-control device 5 and the induction coil 6 are arranged spaced apart with one another with respect to an axial axis 7, wherein the magnetic field conductors 3, with respect to the axial axis 7, are arranged between the temperature-control device 5 and the induction coil 6.

With respect to the axial axis 7, the temperature-control device 5 is arranged located opposite and/or facing temperature-control sides 8 of the magnetic field conductors 3 and mechanically contacts these directly or indirectly. With respect to the axial axis 7, the induction coil 6 is arranged located opposite and/or facing coil sides 9 of the magnetic field conductors 3. The temperature-control sides 8 and the coil sides 9 of the magnetic field conductors 3 are visible in FIG. 2. Each magnetic field conductor 3 has a temperature-control side 8 and a coil side 9 which with respect to the axial axis 7 are arranged spaced apart from one another.

Figure 3:
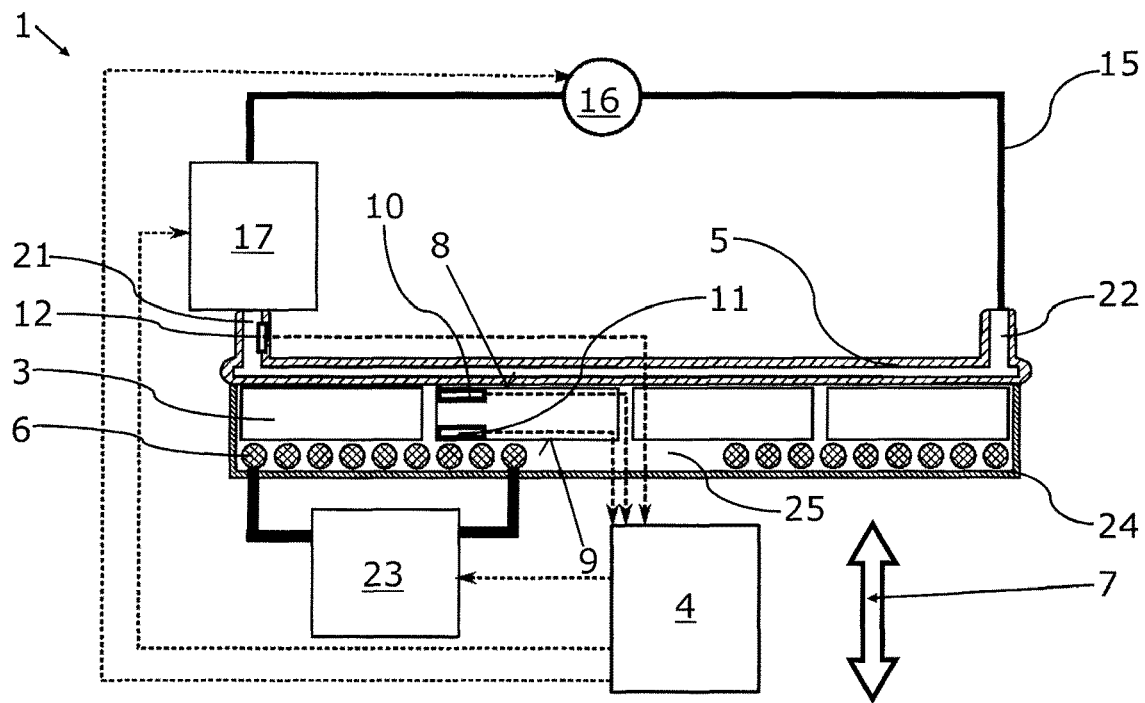
FIG. 3 shows an induction charging device according to the invention with represented temperature-control fluid circuit.

From FIG. 1 and FIG. 3 it is evident that a first temperature sensor 10 for determining a temperature-control-side magnetic field conductor temperature of the temperature-control side 8 is arranged in the housing interior 25, that a second temperature sensor 11 for determining a coil side magnetic field conductor temperature of the coil side 9 is arranged in the housing interior 25, that a temperature-control fluid temperature sensor 12 for measuring a temperature-control fluid temperature of the temperature-control fluid is arranged in the temperature-control device 5 and outside the housing interior 25.

Figure 4:
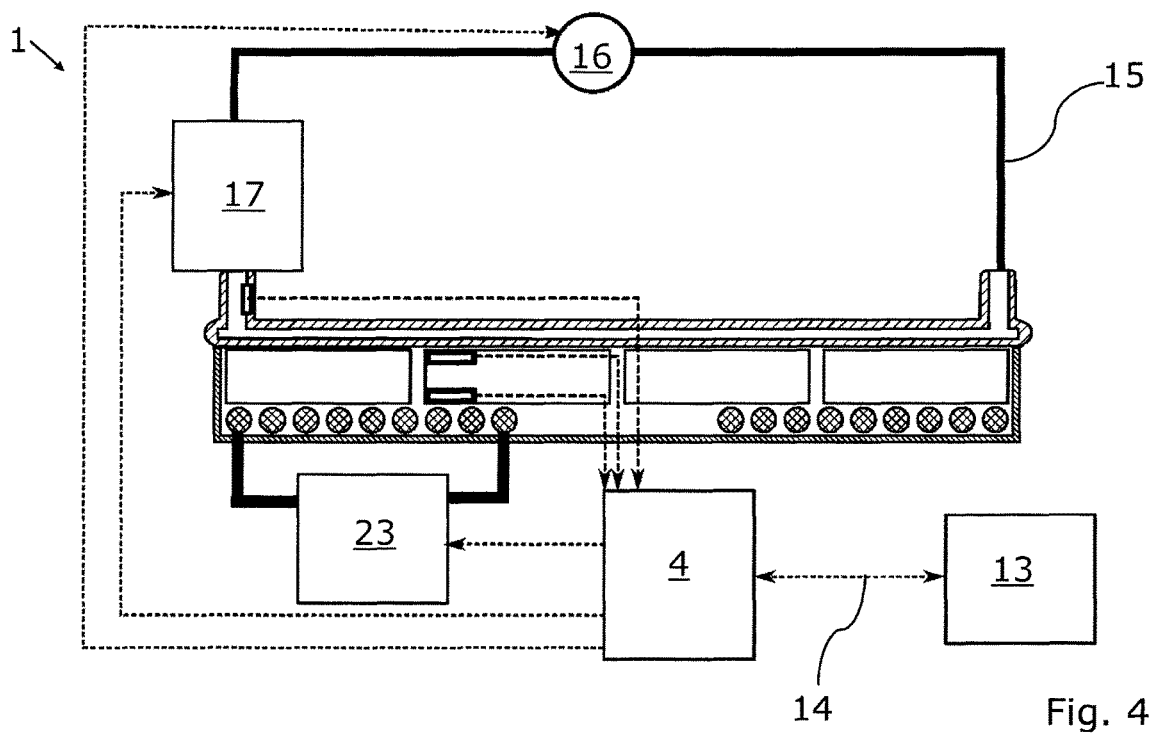
FIG. 4 shows an induction charging device according to the invention with represented temperature-control fluid circuit and separate computer facility.

The first temperature sensor 10, the second temperature sensor 11 and the temperature-control fluid temperature sensor 12 are each communicatingly connected to a control device 4. In FIG. 3 and FIG. 4 communication lines for a communicating connection are shown in dashed lines. The control device 4 is configured and/or programmed for limiting the thermal loading of the magnetic field conductors 3.

The temperature-control device 5 is fluidically connected to a temperature-control fluid circuit 15 via the fluid inlet 21 and the fluid outlet 22. The temperature-control fluid circuit 15 comprises an electrically drive delivery device 16 for adjusting the mass flow of the temperature-control fluid and a heat exchanger device 17 for adjusting the temperature-control fluid temperature of the temperature-control fluid. The delivery device 16 and the heat exchanger device 17 are each communicatingly connected to the control device 4.

Furthermore, the control device 4 can be communicatingly connected to a transmission power adjustment device 23, which can be designed for adjusting the transmission power upon the wireless energy transmission.

The transmission power adjustment device 23 can be designed as software, in particular as software item and/or computer-implemented method within the control device 4. This transmission power adjustment device 23 can prompt for example a stationary induction charging station 18 to have the transmission power adjusted and/or reduced.

By activating the delivery device 16 and/or by activating the heat exchanger device 17, the control device 4 can adjust the temperature-control power of the temperature-control fluid or of the temperature-control device. By activating the transmission power adjustment device 23, the control device 4 can adjust the transmission power during a wireless energy transmission.

The control device 4 carries out an adjustment of the temperature-control power of the temperature-control device 5 and/or an adjustment of the transmission power of the induction charging device 1 in the case that a temperature gradient value is greater than a predefined gradient limit value.

The control device 4 carries out an adjustment of the temperature-control power of the temperature-control device 5 and/or a first adjustment of the transmission power of the induction charging device 1 in the case that a differential value is greater than a predefined differential limit value.

The control device 4 carries out an adjustment of the temperature-control power of the temperature-control device 5 and/or an adjustment of the transmission power of the induction charging device 1 in the case that a determined temperature-control-side magnetic field conductor temperature and/or a determined coil-side magnetic field conductor temperature is greater than a predefined temperature limit value.

Compared with FIG. 3, the control device 4 in FIG. 4 is data connected to a separate computer facility 13 via a data network 14 and transmits to this computer facility 13 for example operating parameters of the induction charging device 1. The computer facility 13 analyses these operating parameters by means of computer-implemented analytical methods and generates a heat transfer characteristic diagram which is transmitted to the induction charging device 1 and can optimise the operation of the same.

FIG. 5 shows a vehicle charging system 2 having a stationary induction charging station 18, which is at least partially formed by an induction charging device 1 according to the invention and a vehicle 19, which comprises a mobile induction device 26, which is at least partially formed by an induction charging device 1 according to the invention, wherein a wireless energy transmission from the stationary induction charging station 18 to the mobile induction charging device 26 of the vehicle 19 can be carried out.

Figure 6:
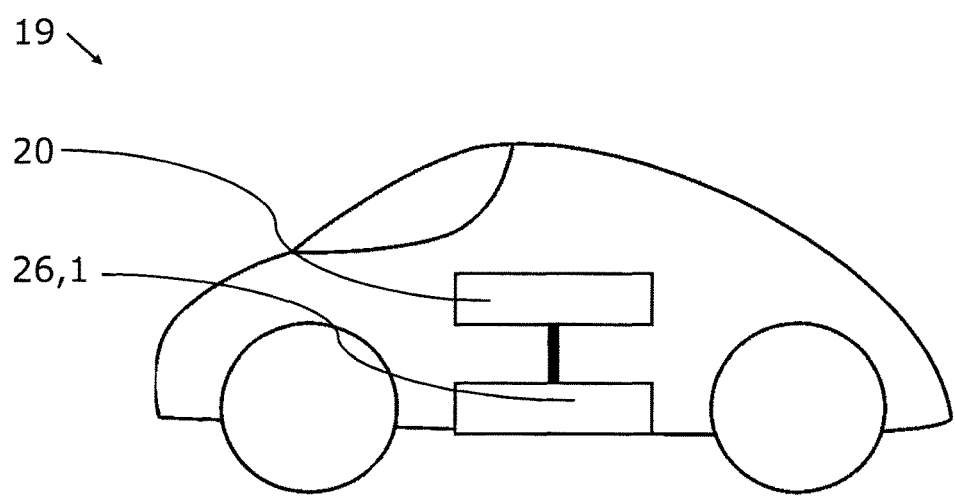
FIG. 6 shows a vehicle according to the invention for a vehicle charging system.

FIG. 6 shows a vehicle 19 for a vehicle charging system 2 having a mobile induction charging device 26 and having a traction accumulator 20, which is electrically coupled to the mobile induction charging device 6 and can be supplied with electric energy via the same.

The invention claimed is:

1. An induction charging device for a vehicle charging system, comprising:
   at least one magnetic field conductor;
   at least one control device;
   at least one temperature-control device configured to temperature-control the at least one magnetic field conductor, the at least one temperature-control device having a temperature-control power that is preset via the at least one control device;
   the at least one temperature-control device configured such that a temperature-control fluid is flowable therethrough;
   at least one induction coil configured to at least one of transmit and receive a wireless energy transmission with a transmission power that is preset via the at least one control device;
   the at least one temperature-control device and the at least one induction coil arranged spaced apart from one another with respect to an axial axis;
   the at least one magnetic field conductor arranged between the at least one temperature-control device and the at least one induction coil with respect to the axial axis;
   with respect to the axial axis, the at least one temperature-control device is disposed at least one of opposite a temperature-control side of the at least one magnetic field conductor and facing the temperature-control side;
   with respect to the axial axis, the at least one induction coil is disposed at least one of opposite a coil side of the at least one magnetic field conductor and facing the coil side;
   a first temperature sensor configured to determine a temperature-control-side magnetic field conductor temperature of the temperature-control side;
   at least one of (i) a second temperature sensor configured to determine a coil side magnetic field conductor temperature of the coil side and (ii) a temperature-control fluid temperature sensor configured to measure a temperature-control fluid temperature of the temperature-control fluid in the at least one temperature-control device;
   wherein the first temperature sensor and the at least one of the second temperature sensor and the temperature-control fluid temperature sensor are each communicatingly connected to the at least one control device; and
   wherein the at least one control device is configured to limit a thermal load of the at least one magnetic field conductor.

2. A method for limiting thermal loading of the at least one magnetic field conductor of the induction charging device according to claim 1, the method comprising:
   transmitting, via the first temperature sensor, a first temperature value to the at least one control device;
   determining, via the at least one control device, the temperature-control-side magnetic field conductor temperature of the temperature-control side based on the first temperature value;
   transmitting, via the second temperature sensor, a second temperature value to the at least one control device;
   determining, via the at least one control device, the coil side magnetic field conductor temperature of the coil side based on the second temperature value;
   determining, via the at least one control device, a temperature gradient value from an absolute amount of a differential between the determined temperature-control-side magnetic field conductor temperature and the determined coil side magnetic field conductor temperature;
   comparing, via the at least one control device, the temperature gradient value with a predefined gradient limit value; and
   when the temperature gradient value is greater than the predefined gradient limit value, adjusting, via the at least one control device, at least one of (i) the temperature-control power of the at least one temperature-control device and (ii) a transmission power of at least one of the induction charging device, the at least one induction coil, and a transmission power adjustment device.

3. The method according to claim 2, further comprising:
   transmitting, via the temperature-control fluid temperature sensor, a measured temperature-control fluid temperature of the temperature-control fluid to the at least one control device;
   determining, via the at least one control device a differential value from an absolute amount of a differential between the determined temperature-control-side magnetic field conductor temperature and the measured temperature-control fluid temperature;

comparing, via the at least one control device, the differential value with a predefined differential limit value; and when the differential value is greater than the predefined differential limit value, adjusting, via the at least one control device, at least one of (i) the temperature-control power of the at least one temperature-control device and (ii) the transmission power of at least one of the induction charging device, the at least one induction coil, and the transmission power adjustment device.

4. The method according to claim 3, further comprising carrying out, via the at least one control device, a wireless energy transmission with a maximum transmission power of the induction charging device when at least one of:

the temperature gradient value is equal to or smaller than the predefined gradient limit value;

the differential value is equal to or smaller than the predefined differential limit value; and at least one of the determined temperature-control-side magnetic field conductor temperature and the determined coil side magnetic field conductor temperature is equal to or smaller than a predefined temperature limit value.

5. The method according to claim 2, further comprising:

comparing, via the at least one control device, at least one of the determined temperature-control-side magnetic field conductor temperature and the determined coil side magnetic field conductor temperature with a predefined temperature limit value; and when the at least one of the determined temperature-control-side magnetic field conductor temperature and the determined coil side magnetic field conductor temperature is greater than the predefined temperature limit value, adjusting, via the at least one control device, at least one of (i) the temperature-control power of the at least one temperature-control device and (ii) the transmission power of the induction charging device.

6. The method according to claim 2, further comprising at least one of:

measuring, via the first temperature sensor, the first temperature value on the temperature-control side of the at least one magnetic field conductor; and measuring, via the second temperature sensor, the second temperature value on the coil side of the at least one magnetic field conductor.

7. The method according to claim 2, further comprising at least one of:

measuring, via the first temperature sensor, the first temperature value at a measurement point on the at least one magnetic field conductor disposed spaced apart from the temperature-control side, and wherein the at least one control device, with a stored transmission function, determines the temperature-control-side magnetic field conductor temperature on the temperature-control side from the first temperature value; and measuring, via the second temperature sensor, the second temperature value at a measurement point on the at least one magnetic field conductor disposed spaced apart from the coil side, and wherein the at least one control device, with a stored transmission function, determines the coil-side magnetic field conductor temperature on the coil side from the second temperature value.

8. The method according to claim 2, further comprising:

correcting, via the at least one control device utilizing at least one stored correcting function, at least one of the first temperature value and the second temperature value with respect to at least one of electromagnetic effects and parasitic thermal effects;

carrying out, via the first temperature sensor, at least one of a contactless temperature measurement and a contacting temperature measurement of the at least one magnetic field conductor; and carrying out, via the second temperature sensor, at least one of a contactless temperature measurement and a contacting temperature measurement of the at least one magnetic field conductor.

9. The method according to claim 2, further comprising:

determining, via the at least one control device and a stored heat transmission characteristic diagram, a time forecast of a temperature gradient for a predefined time interval from at least one operating parameter of the induction charging device;

determining, via the at least one control device, a maximum forecast value within the predefined time interval; and establishing, via the at least one control device the maximum forecast value as the temperature gradient value.

10. The method according to claim 2, further comprising:

transmitting, via the at least one control device, a plurality of operating parameters of the induction charging device to a computer facility that is separate with respect to the induction charging device via a data network; and determining a heat transfer characteristic diagram via the computer facility utilizing computer-implemented analytical methods.

11. The method according to claim 10, further comprising:

transmitting the heat transfer characteristic diagram to the at least one control device via the data network; and superseding a prior heat transfer characteristic diagram stored in the at least one control device with the transmitted heat transfer characteristic diagram.

12. The method according to claim 2, wherein adjusting the temperature-control power includes adjusting at least one of the temperature-control fluid temperature and a mass flow of the temperature-control fluid.

13. The method according to claim 12, wherein at least one of:

adjusting the temperature-control power includes increasing the temperature-control power during a predefined operating period of the induction charging device from a starting value to an end value;

adjusting the temperature-control fluid temperature includes increasing the temperature-control fluid temperature during a predefined operating period of the induction charging device from a starting value to an end value;

adjusting the mass flow of the temperature-control fluid includes increasing the mass flow during a predefined operating period of the induction charging device from a starting value to an end value; and adjusting the transmission power includes increasing the transmission power during a predefined operating period of the induction charging device from a starting value to an end value.

14. The method according to claim 2, wherein adjusting the temperature-control power of the temperature-control device is performed at least one of:

at least one of prior to, simultaneously with, and after adjusting the transmission power of the induction charging device; and prior to transmitting the wireless energy transmission.

15. The method according to claim 2, wherein adjusting the temperature-control power includes adjusting a mass flow of the temperature-control fluid while adjusting the transmission power of the induction charging device to precondition a plurality of components thermally coupled to a temperature-control fluid circuit, which is fluidically connected to the at least one temperature-control device.

16. A computer program, comprising a plurality of commands which instruct an induction charging device to execute the method steps according to claim 2.

17. The induction charging device according to claim 1, wherein:
the at least one temperature-control device is fluidically connected to a temperature-control fluid circuit; and
the temperature-control fluid circuit includes at least one of (i) an electrically driven delivery device configured to adjust a mass flow of the temperature-control fluid and communicatingly connected to the at least one control device and (ii) a heat exchanger device configured to adjust the temperature-control fluid temperature of the temperature-control fluid and communicatingly connected to the at least one control device.

18. A vehicle charging system, comprising:
a stationary induction charging station;
a vehicle including a mobile induction device;
wherein at least one of the stationary induction charging station and the mobile induction device is at least partially formed by the induction charging device according to claim 1; and
wherein the wireless energy transmission is providable from the stationary induction charging station to the mobile induction device of the vehicle.

19. The vehicle of the vehicle charging system according to claim 18, comprising:
a traction accumulator unit electrically coupled to the mobile induction device and suppliable with electric energy via the mobile induction device; and
wherein the mobile induction device is at least partially formed by the induction charging device.

20. A method for operating the vehicle charging system according to claim 18, comprising:
monitoring at least one of a respective temperature and a respective temperature gradient of the stationary induction charging station and the mobile induction device;
transmitting the wireless energy transmission with a maximum transmission power when at least one of:
a respective temperature gradient value in the stationary induction charging station and the mobile induction device is equal to or smaller than a predefined gradient limit value;
a respective differential value in the stationary induction charging station and the mobile induction device is equal to or smaller than a predefined differential limit value; and
at least one of the respective temperature-control-side magnetic field conductor temperature and the respective coil side magnetic field conductor temperature in the stationary induction charging station and the mobile induction device is equal to or smaller than a predefined temperature limit value.

21. The method according to claim 20, wherein the method is a computer-implemented method.

22. The vehicle charging system according to claim 18, wherein the respective at least one control device of the stationary induction charging station and the mobile induction device is configured to perform a method including:
monitoring at least one of a respective temperature and a respective temperature gradient of the stationary induction charging station and the mobile induction device; and
transmitting the wireless energy transmission with a maximum transmission power when at least one of:
a respective temperature gradient value in the stationary induction charging station and the mobile induction device is equal to or smaller than a predefined gradient limit value;
a respective differential value in the stationary induction charging station and the mobile induction device is equal to or smaller than a predefined differential limit value; and
at least one of the respective temperature-control-side magnetic field conductor temperature and the respective coil side magnetic field conductor temperature in the stationary induction charging station and the mobile induction device is equal to or smaller than a predefined temperature limit value.

23. The induction charging device according to claim 1, wherein the at least one control device is configured to limit the thermal load of the at least one magnetic field conductor via performing a method including:
transmitting, via the first temperature sensor, a first temperature value to the at least one control device;
determining, via the at least one control device, the temperature-control-side magnetic field conductor temperature of the temperature-control side based on the first temperature value;
transmitting, via the second temperature sensor, a second temperature value to the at least one control device;
determining, via the at least one control device, the coil side magnetic field conductor temperature of the coil side based on the second temperature value;
determining, via the at least one control device, a temperature gradient value from an absolute amount of a differential between the determined temperature-control-side magnetic field conductor temperature and the determined coil side magnetic field conductor temperature;
comparing, via the at least one control device, the temperature gradient value with a predefined gradient limit value; and
when the temperature gradient value is greater than the predefined gradient limit value, adjusting, via the at least one control device, at least one of (i) the temperature-control power of the at least one temperature-control device and (ii) the transmission power of at least one of the induction charging device, the at least one induction coil, and a transmission power adjustment device.

* * * * *